United States Patent [19]

Johnson et al.

[11] Patent Number: 4,579,810
[45] Date of Patent: Apr. 1, 1986

[54] PROCESS FOR PREPARING SURPRINT PROOF ON A PEARLESCENT SUPPORT

[75] Inventors: Van B. Johnson; Douglas G. Adolphson, both of Towanda, Pa.

[73] Assignee: E. I. Du Pont de Nemours and Company, Wilmington, Del.

[21] Appl. No.: 686,918

[22] Filed: Dec. 27, 1984

[51] Int. Cl.[4] ............................................. G03C 5/00
[52] U.S. Cl. .................................... 430/293; 430/271; 430/533; 430/536; 430/538
[58] Field of Search ............... 430/271, 293, 538, 357, 430/358, 533, 536

[56] References Cited

U.S. PATENT DOCUMENTS 3,649,268  3/1972  Chu et al. .............................. 96/27
3,944,699  3/1976  Mathews et al. ..................... 428/220
4,174,216  11/1979  Cohen et al. ......................... 430/257

Primary Examiner—Jack P. Brammer

[57] ABSTRACT

Process for preparation of improved surprint multilayer proof using at least three nonsilver photoimaged elements, e.g., positive-working photopolymerizable element or negative-working photosensitive element, having a thickness greater than 0.0001 inch (0.0025 mm) which are laminated sequentially to a pearlescent support having total luminous transmission not in excess of 25% and 20° specular gloss in the range of 8 to 20 gloss units, e.g., biaxially oriented polyethylene terephthalate film filled with polypropylene and $BaSO_4$. The surprints are useful in the web fed, publication web and sheet fed segments of the printing market.

13 Claims, No Drawings

PROCESS FOR PREPARING SURPRINT PROOF ON A PEARLESCENT SUPPORT

TECHNICAL FIELD

This invention relates to a process for preparing a surprint multicolor proof on a support. More particularly, this invention relates to the use of a pearlescent support in preparation of a surprint multicolor proof.

BACKGROUND ART

Reproduction processes are known wherein positive-working photopolymerizable elements and negative-working photosensitive elements are exposed imagewise through an original (phototool), and in the case of the latter elements are peeled apart, forming nontacky and tacky image areas. These elements can be used to prepare surprint mulitcolor proofs on a support. Surprint proofs obtained using positive-working photopolymerizable elements are described in Chu and Cohen U.S. Pat. No. 3,649,268 and surprint proofs obtained using negative-working photosensitive elements are described in Cohen and Fan U.S. Pat. No. 4,174,216. Both processes are dry processes utilizing dry particulate tones of suitable colors. Both types of proofing systems are useful for pre-press proofing. The negative-working photosensitive elements are particularly useful in the web fed segment of the printing market. It is desired that the negative-working photosensitive elements be sold in the publication web and sheet fed segments of the printing market. While the quality of the surprints is generally excellent the publication web and sheet fed printing segments of the printing industry have particularly rigid standards which require lower dot gain of the halftone dots. The term "dot gain" means the increase in dot size between printed matter and artwork, i.e., as the result of mechanical and optical operations during halftone plate making and printing. Dot gain is determined by the type of paper, ink, and printing press used to make a reproduction. The mechanical increase may be contributed when printing ink transferred from a halftone plate to a rubber blanket as used in a standard halftone process whereby the ink is squeezed onto a print stock paper surface yielding a dot of larger diameter than the corresponding dot on the halftone printing plate. The increase in dot size contributed by optical operation is the result of light scattering within the paper print stock. Dot gain in photomechanical reproduction processes is caused by the manner in which a proof, e.g., a surprint, scatters or reflects light causing halftone dots to appear larger than their actual physical size would indicate.

It is therefore desired to prepare a surprint multicolor proof which controls the dot gain by reducing light scattering. It is further desired that the result be achieved without changes in the photosensitive elements, toner formulation, or process of manufacture of the photosensitive elements.

DISCLOSURE OF INVENTION

In accordance with this invention there is provided in a process of preparing a surprint multicolor proof having at least three nonsilver halide photoimaged elements having a color-toned layer sequentially laminated to a support wherein each color-toned photoimaged element has been exposed through a different color separation image and the respective color-toned layers having a thickness greater than 0.0001 inch (0.0025 mm) have been colored in a spectral region corresponding to the color separation image used for the exposure, the improvement wherein the support to which the color-toned photoimaged elements are laminated is a pearlescent support having a total luminous transmission not in excess of 25% and 20° specular gloss in the range of 8 to 20 gloss units.

The term "pearlescent support" as used herein means a support wherein at least one surface layer thereof exhibits "pearly" or nacreous luster. The lustrous appearance results from reflection of light from a series of parallel translucent reflecting layers. The origin of nacreous luster is found in Encyclopedia of Polymer Science, John Wiley & Sons, New York, volume 10, pages 193 to 211, 1969.

The opacity of a support, as determined by the total luminous transmission of the support, depends on the thickness of the support. The total luminous transmission of the pearlescent support should not exceed 25%, preferably not exceed 20%, for a support having a thickness of at least 100 μm when measured by ASTM test method D-1003-61. 20° specular gloss, as measured on a Gardner Laboratories Glossgard System 20/60/85 specular glossmeter, is in the range of 8 to 20 gloss units, preferably 10 to 14 gloss units. The 20° specular gloss is a measure of the degree to which a sample approximates a perfect front surface mirror which is assigned the maximum value of 100 gloss units.

In practicing the process of the invention of preparing a surprint multicolor proof positive- or negative-working photosensitive elements are used. In Chu and Cohen U.S. Pat. No. 3,649,268 positive-working elements and surprints made from such elements are described. In Cohen and Fan U.S. Pat. No. 4,174,216 negative-working elements and surprints made from such elements are described. These patents are incorporated herein by reference. The positive-working photohardenable elements comprise (1) a removable support, (2) a photohardenable or photopolymer layer containing at least one free radical initiated, chain propagating, addition polymerizable compound containing at least one terminal ethylenic group, and an addition polymerization initiator activatable by actinic radiation, and, optionally a compatible macromolecular organic polymeric binder, and (3) a strippable cover sheet. The negative-working elements comprise, in order from top to bottom, (1) a strippable cover sheet, (2) a photoadherent layer comprising a material with ethylenically unsaturated or benzophenone type groups, which is generally nontacky, (3) a tonable organic contiguous layer, e.g., a tacky, nonphotosensitive elastomeric layer which is tonable by application of particulate material, and (4) a sheet support.

The positive-working and negative-working elements are used to form surprint elements. Surprint elements are elements wherein at least three, preferably four photosensitive elements that have been imaged and colored with different colorants, e.g., nonsilver halide colored, photoimaged elements, are sequentially laminated or bonded to a suitable support surface of the invention, described more fully below. In forming a surprint element, the cover sheet and sheet support present in the photosensitive elements are removed. Generally a negative-working or positive-working photosensitive element is applied to the outermost colored photoimaged element of the surprint element. When the outer element of the surprint is a negative-working element, it is uniformly or nonimagewise exposed and the cover sheet present is left in place. When the outer element is positive working, it is nonimagewise exposed, and the cover sheet present is removed. Alternatively, the positive working outer element may be exposed through a mezzotint and the cover sheet removed leaving a tacky layer on the surprint. The tacky outer layer of the surprint can be modified as described in Romano U.S. Pat. No. 4,321,302, Charles and Heiart U.S. Pat. No. 4,334,009 and Charles U.S. Pat. No. 4,427,761, the disclosures of which are incorporated herein by reference.

Generally, the surprint element has over its support four imaged colored photopolymer elements, e.g., yellow, magenta, cyan, black, and an optional fifth nonimaged photopolymer element. Colorants and toners used in preparing the surprints are described in Chu and Manger U.S. Pat. No. 3,620,726, Gray U.S. Pat. No. 3,909,282, Manger, Fickes and Long U.S. Pat. No. 4,215,193 and Cohen and Fan U.S. Pat. No. 4,286,046, which are incorporated herein by reference. The toners include cellulose acetate, cellulose acetate butyrate, ethyl cellulose, ethyl hydroxyethylcellulose resin particles having different colored pigments on their surfaces. The thickness of the nonsilver halide color-toned elements (layers) range from 0.0001 to 0.0005 inch (0.0025 to 0.013 mm) preferably 0.0003 to 0.0006 inch (0.0076 to 0.015 mm).

The critical component of the surprint proof according to this invention is the support to which the positive-working and negative-working photosensitive elements are sequentially laminated. Previously supports of paper, e.g., Kromekote ® cast-coated one-side paper manufactured by Champion Paper and Fiber Company (nonfilled paper), Baryta Paper marketed by the Intermills Corporation, Belgium, have been used. It has been found that the particular support has an affect on the manner in which the surprint scatters or reflects light thereby affecting "dot gain", or as is known in the proofing trade, proof fullness. The halftone dots of the image appear larger than their actual physical size would indicate. In order to reduce the fullness of the halftone image by reducing light scattering various types of pearlescent supports have been found to be useful. The support should have the properties of total luminous transmission and 20° specular gloss values described above. These properties in a support can be achieved in various ways as follows:

(1) Paper or polymeric film can be coated with dispersions of narcreous pigments. Suitable papers include: Kromekote ® cast-coated-one side paper; resin coated paper, e.g., Schoeller paper with polyethylene melt coating on 2 sides, Baryta ® paper marketed by Intermills Corp., Belgium, and polymeric films, e.g., polyethylene terephthalate, etc. Useful nacreous pigment dispersions include: $TiO_2$-coated mica present in an elastomeric binder composition, e.g., chlorosulfonated polyethylene, $TiO_2$-coated mica present in an acrylic binder composition, e.g., poly(methyl methacrylate), etc.;

(2) Polymeric films can be filled with pigments, e.g., polyethylene terephthalate which has been biaxially oriented is filled with $BaSO_4$ or $TiO_2$, e.g., the blend is extruded as a film quenched, and biaxially oriented (voided) by stretching in mutually perpendicular directions and heat setting the films as described in Mathews et al U.S. Pat. No. 3,944,699; and polypropylene filled with $CaCO_3$;

(3) Polyethylene terephthalate film can be filled with air as described in Mathews et al U.S. Pat. No. 3,944,699.

Other additional supports, e.g., paper laminated with a thin layer of biaxially oriented polyethylene terephthalate filled with polypropylene and/or $BaSO_4$ or $TiO_2$, are useful provided they have the properties specified above. The oriented polyethylene terephthalate films may have an adhesion promoting coating or sublayer applied to the surface to which the color-toned layer of the photoimaged elements is laminated. Suitable sublayers are: polyvinyl chloride, poly(methyl methacrylate), etc. Optionally the backside of the polymeric supports can be corona discharge treated and/or coated with known antistatic agents to reduce static attracted dirt thereby assuring better contact between the treated element and the pearlescent support. A preferred mode of a positive-working surprint is shown in Example 1 and of a negative-working surprint is shown in Example 2.

INDUSTRIAL APPLICABILITY

The process of the invention is useful in the preparation of high quality surprints utilizing either positive-working photopolymerizable elements or negative-working photosensitive elements which are sequentially laminated to an improved support whereby dot gain of image halftone dots is substantially curtailed. The surprint supports which reduce light scattering possess high reflectances, high specular/diffuse reflection ratios and high opacity. The high quality surprints are useful as proofs in the web fed as well as the publication web and sheet fed segments of the printing market.

EXAMPLES

The following examples illustrate the invention wherein the parts and percentages are by weight. The molecular weights of polymeric compounds are weight average molecular weights ($\overline{M}_w$). The $\overline{M}_w$ of polymers can be determined by using a light scattering technique using known standard samples, e.g., polystyrene, polymethacrylic acid, polymethylmethacrylate, etc., as known to those skilled in the art.

EXAMPLE 1

A photopolymerizable composition is prepared as described in Charles U.S. Pat. No. 4,427,761, column 6, lines 6 to 20, which is incorporated herein by reference. The mixture is coated onto a 0.001 inch (0.0025 cm) thick polyethylene terephthalate support and a 0.001 inch (0.0025 cm) thick cover sheet of polypropylene is laminated onto the coating at room temperature. The cover sheet is removed at room temperature with substantially no effect on the photopolymerizable layer, and the layer is laminated at about 110° C. by means of a fixed-bed transfer machine as described in Chu et al U.S. Pat. No. 3,594,535, incorporated herein by reference to a pearlescent support having a total luminous transmission not in excess of 20% and 20° specular gloss of 11 gloss units. The pearlescent support is biaxially oriented polyethylene terephthalate film filled with polypropylene and $BaSO_4$, 0.009 inch (0.229 mm) in thickness. The photopolymer layer is exposed at a distance of about 27 inches (68.6 cm) through a minus-blue separation halftone positive for about 8 seconds using a nuArc ® Plate Maker "Flip Top", Model FT26M-2 carbon arc light source. Other light sources that can be used include Violux ® and Addalux ® light sources.

Generally the sources are rated 5 KW although some are rated 2 KW. Typical light exposures for 29 by 40 inches (73.66 by 101.6 cm) proofs (lamp (photopolymer bulb with Kokomo ® filter, No. 400, Kokomo Opalescent Glass Co., Kokomo, IN) to proof distance ~40 inches (101.6 cm)) are 15 to 20 seconds for positive-working photopolymer. The polyethylene terephthalate support is removed at room temperature and Dalamar ® yellow tone (Pigment yellow 74 C.I. #11741) prepared according to Example 9 of Manger et al., U.S. Pat. No. 4,215,193 is applied to the photopolymer surface. Excess toner is removed with a cotton pad. The toner adheres only to those areas that were not exposed to the radiation.

The cover sheet is removed from a second element coated with the above-described composition, and the clear photopolymer layer is laminated onto the yellow-toned layer, obtained above, at a temperature of 110° C. The two-layer film base is exposed through a minus-green separation halftone positive for 3 seconds using the nuArc ® light source. The base support is stripped from the photopolymer, and a magenta toner, a dispersion consisting of 50 percent mixture of quinacridone magenta, Quindo Magenta (C.I. Pigment Red 122) and Indo Brilliant Scarlet toner (Pigment Red 123, C.I. #71145) and 50 percent cellulose acetate, prepared as described in Example 11 of Manger et al. U.S. Pat. No. 4,215,193, is applied to the exposed surface at room temperture. The excess toner is dusted off with a cotton pad, the pigment adhering to the underexposed areas only.

The cover sheet is removed from a third photopolymerizable element coated with the abovedescribed composition and the clear photopolymer layer is laminated onto the magenta-toned layer, obtained above, at a temperature of 110° C. This is exposed through the minus-red halftone positive for 3 seconds using the nuArc ® light source. The polyethylene terephthalate support is removed from the layer, and a phthalocyanine cyan toner, a dispersion of 50 percent mixture of Monastral ® Blue G (Copper Phthalocyanine Pigment Blue 15, C.I. #74160) and Monastral ® Green G (Pigment Green 7, C.I. #74260) and 50 percent cellulose acetate prepared as described in Example 1 of Manger et al U.S. Pat. No. 4,215,193 is dusted onto the exposed surface at room temperature. The excess toner is removed with a cotton pad, leaving pigment in the underexposed areas only.

A fourth photopolymerizable layer is laminated onto the cyan-toned layer of the three-layer film base using the same procedure and under the same conditions used in preparing the two previous layers. The fourth layer is exposed through a black printer halftone positive for 3 seconds using the nuArc ® light source. After stripping off the polyethylene terephthalate support, a carbon black toner, Carbon Black, Sterling ® NS N774 (C.I. Pigment Black 7, C.I. #77266) prepared as described in Example 10 of Manger et al. U.S. Pat. No. 4,215,193, predispersed in pentaerythritol resin is applied to the exposed surface at room temperature. The excess pigment is dusted off with a cotton pad, leaving pigment in the underexposed areas only.

A fifth photopolymerizable layer is laminated over the four color proof and the layer is overall exposed for 12 seconds through its polyethylene terephthalate support using the nuArc ® light source. The support is removed and an excellent protected four color proof is obtained. The proof is superior to a similar type proof in which the support is a nonpearlescent, nonfilled commercially available paper, Kromekote ® cast-coated one-side paper which has a 20° specular gloss of 25 gloss units.

EXAMPLE 2

A negative-working pre-press color proof of the surprint type is prepared as described in Romano U.S. Pat. No. 4,321,320, column 5, line 21 to column 6, line 2, which is incorporated herein by reference. The polyethylene terephthalate film with the siloxane release coating is stripped from the tonable, tacky layer and the resulting element is then laminated at 100° C. to the pearlescent support described in Example 1. The element is then exposed to a halftone negative, minus-blue, color separation film record, the exposure being made through the electrostatic discharge treated, clear polyethylene terephthalate film. This exposure is about 30 seconds on an exposing device identified as a Berkey-Ascor Vacuum Printer, fitted with a photopolymer lamp (2 KW) and a Kokomo ® glass filter (No. 400) Kokomo Opalescent Glass Co., Kokomo, IN. Other exposure devices can be used, e.g., as described in Example 1. The distance between the lamp and the vacuum frame of this device is about 38 inches (96.52 cm). After the exposure is made, the exposed element is taped securely to a suitable flat surface, and the clear polyethylene terephthalate film cover sheet is stripped by pulling at one corner with an even, continuous motion at an angle of about 135°-180°. This can be done at elevated temperature, e.g., 32° C. The resulting exposed, photopolymerized image photoadheres to the electrostatic discharge treated film and is removed with the film thus uncovering equivalent areas of the tacky, elastomer contiguous layer on the paper support. The bared areas of the contiguous layer are toned using a yellow toner, Dalamar ® Yellow (Pigment Yellow 74, C.I. No. 11741). A second laminate (III) having its polyethylene terephthalate film with release coating removed as described above is laminated to the surface of the yellow image and is exposed to a halftone, negative, minus-green color separation film record in registration. The clear, surface treated polyethylene terephthalate film of the second laminate is stripped from the contiguous layer leaving bared an image which is toned with a magenta toner as described above. The process is then repeated for the minus-red (cyan toner) and black negative records. The toners used are described in Example 1 above. This procedure yields an excellent four-color negative surprint proof.

We claim:

1. In a process of preparing a surprint multicolor proof with substantially reduced dot gain having at least three nonsilver halide photoimaged and color-toned elements, each having a thickness greater than 0.0001 inch (0.0025mm), sequentially laminated to a support, wherein each color-toned photoimaged element has been exposed through a different color separation image and colored in a spectral region corresponding to the color separation image used for the exposure, and wherein said support has a total luminous transmission not in excess of 25%, the improvement wherein the support to which the color-toned photoimaged elements are sequentially laminated is a pearlescent support having 20° specular gloss in the range of 8 to 20 gloss units.

2. In a process of preparing a surprint multicolor proof with substantially reduced dot gain having at least three nonsilver halide photoimaged and color-toned elements, each having a thickness greater than 0.0001 inch (0.0025mm), sequentially laminated to a support, wherein each color-toned photoimaged element has been exposed through a different color separation image and colored in a spectral region corresponding to the color separation image used for the exposure, and wherein said support has a total luminous transmission not in excess of 25%, the improvement wherein the support to which the color-toned photoimaged elements are sequentially laminated is a pearlescent support coated with a dispersion of a nacreous pigment having 20° specular gloss in the range of 8 to 20 gloss units.

3. A process according to claim 2 wherein the support is paper.

4. A process according to claim 2 wherein the support is a polymeric film.

5. A process according to claim 3 wherein the nacreous pigment is $TiO_2$-coated mica in an elastomeric polymeric binder.

6. A process according to claim 4 wherein the nacreous pigment is $TiO_2$-coated mica in an elastomeric polymeric binder.

7. A process according to claim 5 wherein the elastomeric polymeric binder is chlorosulfonated polyethylene.

8. A process according to claim 6 wherein the elastomeric polymeric binder is chlorosulfonated polyethylene.

9. A process according to claim 1 wherein the pearlescent support is an oriented polyethylene terephthalate film filled with polypropylene and/or $BaSO_4$.

10. A process according to claim 1 wherein the pearlescent support is a polypropylene film filled with $CaCO_3$.

11. A process according to claim 1 wherein the pearlescent support is polyethylene terephthalate filled with air.

12. A process according to claim 1 wherein the photoimaged element comprises prior to exposure a nontacky photohardenable material with ethylenically unsaturated or benzophenone type groups and a contiguous layer of a nonphotosensitive, tacky organic material.

13. A process according to claim 1 wherein the photoimaged element comprises prior to exposure a tacky photopolymerizable layer.

* * * * *